| United States Patent [19] | [11] Patent Number: 4,576,859 |
|---|---|
| Oyachi et al. | [45] Date of Patent: Mar. 18, 1986 |

[54] RADIO WAVE SHIELDING MATERIALS AND A METHOD OF PRODUCING THE SAME

[75] Inventors: Tomio Oyachi, Tokorozawa; Hiroya Fukuda, Yokohama; Masahiko Anami, Tokyo, all of Japan

[73] Assignee: Bridgestone Corporation, Tokyo, Japan

[21] Appl. No.: 663,657

[22] Filed: Oct. 22, 1984

[30] Foreign Application Priority Data

Oct. 21, 1983 [JP] Japan .................. 58-196022

[51] Int. Cl.$^4$ ................................ B32B 3/24
[52] U.S. Cl. .................. 428/311.1; 427/244; 427/247; 427/443.1; 428/311.5; 428/312.2; 428/312.8
[58] Field of Search ............ 427/227, 244, 247, 443.1; 428/311.1, 311.5, 312.2, 312.8

[56] References Cited

U.S. PATENT DOCUMENTS

| 3,549,423 | 12/1970 | Grubb et al. ............... 428/311.1 |
| 3,666,526 | 5/1972 | Ettinger et al. ............ 428/312.2 |
| 4,076,888 | 2/1978 | Perugini et al. ........... 427/244 |
| 4,246,057 | 1/1981 | Janowski .................... 427/227 |
| 4,271,045 | 6/1981 | Steigerwald ............... 427/227 |
| 4,276,107 | 6/1981 | Pufahl ........................ 427/244 |
| 4,454,191 | 6/1984 | von Blücher et al. ..... 428/311.5 |
| 4,526,826 | 7/1985 | Ten Eyck et al. ......... 428/311.5 |

*Primary Examiner*—William J. Van Balen
*Attorney, Agent, or Firm*—Sughrue, Mion, Zinn, Macpeak, and Seas

[57] ABSTRACT

A radio wave shielding material and a method of producing the same are disclosed. The radio wave shielding material comprises a plastic foamed body of three-dimensional network skeleton structure, a metal plating coat formed on the skeleton surface, and a coating of conductive rubber and/or plastic formed on the metal plating coat.

12 Claims, 4 Drawing Figures

RADIO WAVE SHIELDING MATERIALS AND A METHOD OF PRODUCING THE SAME

BACKGROUND OF THE INVENTION

1. Field of the Invention

This invention relates to a radio wave shielding material and a method of producing the same.

2. Description of the Prior Art

Electron applied instruments and machines (hereinafter referred to as electron application apparatus) such as personal computer, office automation (OA) instrument, factory automation (FA) machine, home automation (HA) instrument, television game machine, personal radiocommunication system and the like are in wide spread use in offices, factories, homes and public facilities. For this reason, radio wave interference against other electron instruments and machines due to radiation leakage from the above electron application apparatus, such as erroneous operation, communication interference and the like have created problems. In U.S.A., the Federal Communication Commission (FCC) has announced regulation values of the maximum acceptable field strength in radio wave leakage from the above electron application apparatuses dividing into class A (commercial use) and class B (home use), which have completely been practised from Oct. 1, 1983. In Japan, a conference on the above problems was made in the radio wave council in Ministry of Posts and Telecommunications and consequently the regulation value of the leaked radio waves will be established within a few years.

Thus, countermeasures for shielding such radio waves are urgently needed in the field of manufacturing the electron application apparatus, and it is a requirement to develop radio wave shielding materials having excellent shielding performance.

In order to shield the leakage of radio wave from the electron application apparatus to the outside, a metal or a composite material having an electric conductivity is used as a material constituting the casing of the electron application apparatus and is sufficiently grounded, whereby this object can be achieved. In this case, however, it is important to prevent the leakage of radio wave, particularly high frequency pulsive wave from the joint portion of the casing or gaps at contact portions with an openable door and the like. Therefore, a hollow extrusion molded article of a conductive rubber or a gasket or a packing composed of a knitted body of metal wires has hitherto been used in the gap of the conductive casing for shielding the radio wave leaked from such gap, which has various drawbacks as will be mentioned.

That is, the hollow extrusion molded articles made from rubber materials kneaded with a conductive filler, typically conductive silicone rubber as a radio wave shielding gasket have a volume resistivity of about 100 Ω·cm as a practical limit and are low in the conductivity at a high frequency range, so that they are insufficient in radio wave shielding performance. On the other hand, since the gasket composed of the knitted body of metal wires is high in rigidity and bad in the adhesion, a gap is formed between the casing and the gasket, from which radio waves leaks. Further, the conduction mechanism of the knitted body is based on the contact between the wires, so that the electric resistance at a high frequency range becomes very high and the radio wave shielding property lowers.

Particularly, the radio wave shielding materials suitable for use in the computer, measuring instrument, audio apparatus and the like are strongly required to have a high radio wave shielding property (60~80 dB) over a wide frequency range of from low frequency (30 MHz) to high frequency (500~1,000 MHz) and a good compression modulus capable of flexibly fitting into or closably contacting with the gap of the casing for the electron application apparatus.

SUMMARY OF THE INVENTION

The inventors have made various studies with respect to the development of radio wave shielding materials which overcome the aforementioned drawbacks and have an excellent radio wave shielding property and a good compression modulus, and as a result the invention has been accomplished.

According to a first aspect of the invention, there is the provision of a radio wave shielding material, which comprises a plastic foamed body having a three-dimensional network skeleton structure and provided on its skeleton surface with a metal plating coat, and a coating of a conductive rubber and/or plastic formed on said metal plating coat.

According to a second aspect of the invention, there is the provision of a method of producing a radio wave shielding material, which comprises forming a metal plating coat on a surface of a plastic foamed body having a three-dimensional network skeleton structure;

impregnating or applying a liquid composition containing a conductive rubber and/or plastic to said plastic foamed body;

subjecting the body to a compression deformation to squeeze out an excess amount of said liquid composition while the metal plating coat is partially broken to provide a proper compression modulus; and curing the conductive rubber and/or plastic.

DETAILED DESCRIPTION OF THE INVENTION

Figure 1:
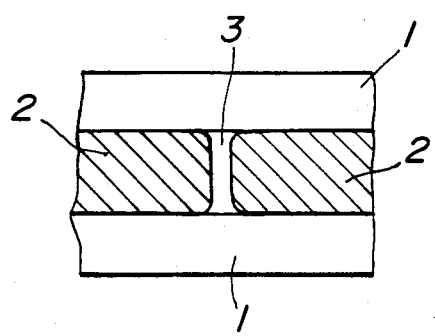
FIG. 1 is a partial diagrammatic view illustrating the contact state between the casing and the conventional radio wave shielding gasket.

As the plastic foamed body having the three-dimensional network skeleton structure, according to the invention, use may be made of polyethylene foam, polypropylene foam, polyvinyl chloride foam, polyurethane foam, polyimide foam, polybutadiene foam and elastic foams with interconnected voids obtained by subjecting the foam to a modification treatment or a surface treatment. Among them, the open-cell polyurethane foam, which is obtained by subjecting the polyurethane foam to an alkali treatment or an explosion treatment to remove cell membranes existent in the three-dimensional network skeleton structure, is preferably used because it has good elastic properties, a uniformity in foam structure and a good adhesion to the metal plating coat.

The foamed body according to the invention is preferable to have a porosity such that the average cell number per 25 mm of straight line is within a range of 10 to 40 cells. When the average cell number is less than 10 cells/25 mm, it is difficult to shield a high frequency pulsive wave with the foam, while when the average cell number exceeds 40 cells/25 mm, the compression modulus of the foam becomes excessively high and also it is difficult to form the metal plating coat on the inside of the foam due to the fine cell structure in view of the productivity.

In the radio wave shielding material according to the invention, the metal plating coat is formed on the surface of the skeleton in the plastic foamed body having the three-dimensional network skeleton structure as a substrate. This metal plating coat provides a radio wave shielding property. Therefore, it is preferable that the volume resistivity of the substrate is not more than 100 $\Omega \cdot cm$ from the viewpoint of the radio wave shielding property. On the other hand, it is preferable that the metal plating coat has a thickness of not more than 6$\mu$ from the viewpoint of the compression modulus.

The formation of the metal plating coat may easily be performed by the usual electroless plating process. As the metal used in the electroless plating, mention may be made of nickel, copper, chromium, gold, silver, platinum, cobalt, nickel-phosphorus alloy, nickel-boron alloy and the like. Among them, the use of nickel or nickel alloy is preferable in view of the balance among corrosion resistance, conductivity and cost.

Moreover, the plastic foamed body having the three-dimensional network skeleton structure may be subjected to a chemical surface treatment with an acid or alkali solution or a surface treatment by low temperature plasma with oxygen or the like before the electroless plating, whereby the adhesion between the metal plating coat and the surface of the plastic foamed body can be enhanced.

The plastic foamed body once provided with the metal plating coat loses its elasticity after the electroless plating. Therefore, it is necessary to restore the elasticity of the foamed body by compression deformation in order that a proper compression modulus is given to the metal plating coat for flexibly clogging the gap of the casing to completely shield the radio wave. That is, when the foamed body is subjected to the compression deformation, the metal plating coat existent on the skeleton surface is partially broken to restore the elasticity of the substance. Such a compression deformation is particularly convenient to be performed in the production of the radio wave shielding material though it is considered to perform the compression deformation during the use of the shielding material. The compression deformation is simultaneously achieved in the formation of the conductive rubber and/or plastic coating as mentioned below.

The proper amount of compression deformation is within a range of 10–90% as a compression strain. If the amount is outside the above range, excess and deficiency give rise in the compression modulus and elastic restoring property. Thus, it is better to conduct the compression deformation under such a condition that the compression modulus is not more than 2 kg/cm$^2$. Although the compression deformation may be independently performed after the formation of the metal plating coat, it is preferable that the compression deformation is simultaneously conducted together with the squeezing out of the excess amount of the liquid composition at the coating step of conductive rubber and/or plastic as mentioned below in view of the production step of the radio wave shielding material.

According to the invention, the coating of conductive rubber and/or plastic is further formed on the metal plating coat. As the conductive rubber and/or plastic are used rubber and/or plastic compositions each containing a conductive filler such as conductive carbon, metal powder, metal fiber or the like. Among them, conductive silicone rubber containing a conductive carbon, conductive acrylic rubber containing a flame retardant, modified conductive acrylic rubber are excellent in the electric conductivity, flame retarding properties, ozone resistance, compression restoring property and coating workability, and are most preferably used.

In the conductive rubber and/or plastic coating according to the invention, the volume resistivity is desirable to be not more than 100 $\Omega \cdot cm$, and preferably not more than 30 $\Omega \cdot cm$.

The conductive rubber and/or plastic coating is formed by impregnating or applying a liquid composition containing the conductive rubber and/or plastic into the plastic foamed body of three-dimensional network skeleton structure provided at its surface with the metal plating coat, applying compression deformation with rolls or the like to squeeze out the excess amount of the liquid composition, and then drying and curing.

The forming of the conductive rubber and/or plastic coating on the metal plating coat under the compression deformation as mentioned above is a significant technique of the invention.

Since the radio wave shielding material according to the invention has a lamination structure that the metal plating coat is formed on the surface of the plastic foamed body with the three-dimensional network skeleton structure having interconnected voids and the conductive rubber coating is further formed on the metal plating coat after the compression deformation, it has high electric conductivity and impedance capable of efficiently shielding high frequency radio wave. Furthermore, the radio wave shielding material according to the invention can flexibly and elastically close to the gap of the casing without losing the rubber elasticity even under repetitive compression accompanied with the opening and closing operation because of the compression modulus of not more than 2 kg/cm$^2$. Moreover, the peeling off of the metal plating coat is completely prevented by the presence of the conductive rubber coating.

Figure 2:
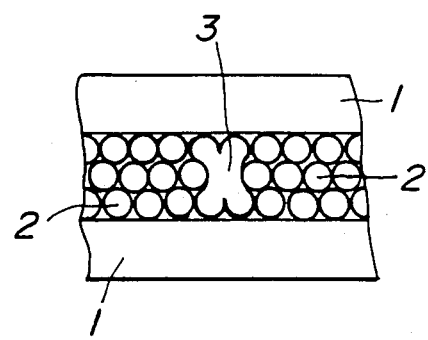
FIG. 2 is a partial diagrammatic view illustrating the contact state between the casing and the radio wave shielding gasket according to the invention.

Also, the radio wave shielding material according to the invention has a merit that the conduction (grounding property) between the casing and the shielding material is complete. That is, in the conventional radio wave shielding material, the contact part between the casing 1 and the gasket (shielding material) 2 is one-dimensional line as shown in FIG. 1, so that the leakage of radio waves from non-contact part 3 can not be prevented. On the other hand, according to the invention, the casing 1 is contacted with the shielding material 2 in two-dimensional network form as shown in FIG. 2, so that even if non-contact part 3 is existent in the shielding material, the conduction (grounding property) between the casing and the shielding material can be brought by the network around the non-contact part to completely shield the leakage of the radio wave between the casing and the shielding material. Regarding the radio wave shielding performance of the shielding material, it is particularly said that the shielding property to high frequency pulsive wave is governed by the conduction (grounding property) between the casing and the shielding material rather than by the electric conductivity of the shielding material. In this point, the radio wave shielding material according to the invention has an excellent merit.

The radio wave shielding material according to the invention is attached to the casing as follows. That is, when the casing is provided with a fitting groove or hook, the shielding material may be attached to the casing without a special treatment. On the other hand, when using the casing of planar structure, a conductive bonding agent may be wholly applied to at least one surface of the shielding material or a non-conductive bonding agent may be locally applied thereto and then a release paper may be placed thereon prior to attachment. If the bonding agent is applied over the whole surface of the shielding material, it is necessary to have an electric conductivity for the grounding, while if the non-conductive bonding agent is locally applied to the shielding material, it is necessary to achieve contact conduction between the shielding material and the casing in the compression operation. Particularly, the conductive bonding agent is required to have a volume resistivity of not more than 20 Ω·cm for providing a good grounding property.

Then, the invention will be described in detail with respect to the method of producing radio wave shielding materials.

First, the metal plating coat is formed on the surface of the plastic foamed body with three-dimensional network skeleton structure having interconnected voids by the aforementioned electroless plating process. Then, the plastic foamed body provided with the metal plating coat is sufficiently impregnated or applied with a liquid composition or a dispersion containing a conductive rubber and/or plastic such as conductive silicone rubber, conductive acrylic rubber (latex) or the like by spraying at both sides, and thereafter passed through rolls or the like to squeeze out the excess amount of the liquid composition and to simultaneously deform the metal plating coat to give a proper compression modulus to the plastic foamed body. In this case, the roll gap (clearance) is adjusted so that the compression deformation is within a range of 10-90% as compression strain. Next, the thus treated plastic foamed body is placed in a heating chamber to evaporate the volatile components of the liquid composition and heat to conduct the curing of the composition. Drying and curing conditions are important factors exerting on the performances of the radio wave shielding material. Therefore, drying is desirable to be performed at a temperature as high as possible within a temperature range capable of restraining the foaming and the curing, while the curing is required to take temperature and time enough to cure the surface inside the foamed body.

The radio wave shielding material is actually used in the form of continuous lengths having a rectangular, trapezoidal, circular or ellipsoidal shape in section. For this purpose, two procedures, maybe followed one of which being a case that the foamed body is previously cut into the continuous length and then subjected to a surface working according to the above mentioned method, and the other of which being a case that the foamed body is first subjected to the above surface working and then cut into a desired continuous length.

The radio wave shielding materials according to the invention have excellent ozone resistance, flame retarding properties, heat resistance, humidity resistance, air permeability and the like in addition to the improved radio wave shielding property, flexible compression elasticity and simple production method as previously mentioned and are light in the weight and good in the attaching workability. Hence, they are favorably used as a gasket or a packing for shielding radio waves at the gap of the casing for computer, measuring instrument, audio apparatus, OA instrument and the like or the gap between the casing and openable door.

The invention will be concretely described with reference to an example.

Figure 3:
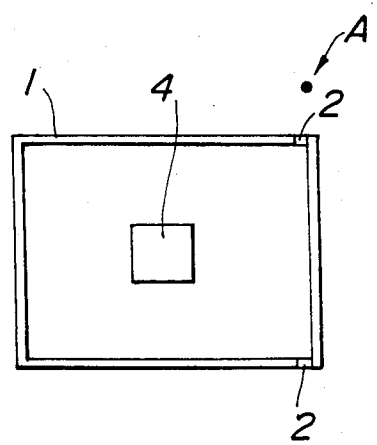
FIG. 3 is a schematic view of an apparatus for the measurement of radio wave shielding property.
Figure 4:
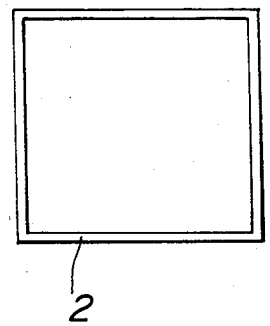
FIG. 4 is a schematic view illustrating the shape of the gasket used in the measurement.

In this example, the radio wave shielding property is measured by means of an apparatus shown in FIG. 3. That is, a gasket having a shape as shown in FIG. 4 is first attached to four corners of a lid 4 for a metallic casing 1 including an oscillator, and thereafter the lid 4 is mounted onto the casing 1 so that the gap between the casing and the lid (clearance) is 5 mm. Then, the field strengths in the presence and absence of the gasket are measured at a point A, from which the radio wave shielding property is calculated according to the following equation:

Radio wave shielding property
$(dB) = 20 \cdot \log(E_B/E_A)$, in which $E_A$ is a value of field strength measured in the absence of the gasket, and $E_B$ is a value of field strength measured in the presence of the gasket.

EXAMPLE

Each of three polyurethane foamed bodies with an open-cell, three-dimensional network skeleton structure having interconnected voids (made by Bridgestone Corporation; trade name Everlite-Scott HR-13, HR-20, HR-30; the cell number per 25 mm is 13, 20, and 30, respectively) was cut into a shape of 8×14×2,000 mm and then a metal plating coat was formed thereon by using a commercially available electroless nickel solution at the following steps:

(1) preliminary treatment (alkali solution), 45° C.×5 minutes immersion;
(2) washing with water;
(3) catalyst, 30° C.×3 minutes immersion;
(4) washing with water;
(5) accelerator, 55° C.×1 minute immersion;
(6) washing with water;
(7) electroless nickel plating (TMP-RT powder process), 40° C.×20 minutes immersion; and
(8) washing with water and drying.

Then, the above treated foamed body was impregnated with a conductive rubber dispersion obtained by adding an emulsion-type flame retardant (made by Kashima Kogyo K.K.) to a conductive acrylic rubber (latex, made by Nippon Zeon K.K.) in an amount of 10% by weight as a solid content and passed through rolls at a clearance of 4.5 mm to squeeze out the excess amount of the dispersion and at the same time to apply compression deformation of about 45% to the metal plating coat. Next, the foamed body was dried in a drying chamber held at 80°~100° C. for 20 minutes, and then heated at 150° C. for 20 minutes to obtain a radio wave shielding material (gasket) according to the invention.

For the comparison, a hollow extrusion molded article (outer diameter: 8 mm) of a conductive silicone rubber (trade name, TSE 2951 U) made by Toshiba Silicone K.K. and a knitted body of a plastic tube (outer diameter: 8 mm) with metal wires were used as a gasket.

The radio wave shielding property was measured with respect to these gaskets to obtain results as shown in the following Table 1.

TABLE I

| Sample | | Comparative Example | | Example | | |
|---|---|---|---|---|---|---|
| | | Hollow extrusion molded article | Knitted body | HR-13 | HR-20 | HR-30 |
| Radio | 50 MHz | 60 | 80 | 120 | 120 | 120 |
| wave | 100 MHz | 40 | 70 | 120 | 120 | 120 |
| shielding | 200 MHz | 30 | 60 | 115 | 115 | 120 |
| property | 300 MHz | 20 | 40 | 110 | 115 | 115 |
| (dB) | 400 MHz | 20 | 30 | 105 | 110 | 110 |
| | 500 MHz | 20 | 20 | 100 | 105 | 105 |

As apparent from Table 1, the radio wave shielding materials according to the invention have a very excellent radio wave shielding property.

What is claimed is:

1. A radio wave shielding material comprising a plastic foamed body having a three-dimensional network skeleton structure and provided on its skeleton surface with a metal plating coat, and a coating of a conductive rubber and/or plastic formed on said metal plating coat.

2. A radio wave shielding material according to claim 1, wherein said plastic foamed body is an open-cell polyurethane foam of three-dimensional network skeleton structure having such a porosity that an average cell number per 25 mm of straight line is 10–40 cells.

3. A radio wave shielding material according to claim 1, wherein said plastic foamed body has a volume resistivity of not more than 100 $\Omega$·cm.

4. A radio wave shielding material according to claim 1, wherein said metal plating coat is nickel or nickel alloy plating coat.

5. A radio wave shielding material according to claim 1, wherein said metal plating coat has a thickness of not more than 6$\mu$.

6. A radio wave shielding material according to claim 1, wherein said conductive rubber and/or plastic is selected from conductive silicone rubber, conductive acrylic rubber and modified conductive acrylic rubber.

7. A radio wave shielding material according to claim 1, wherein said coating of conductive rubber and/or plastic has a volume resistivity of not more than 100 $\Omega$·cm.

8. A radio wave shielding material according to claim 1, wherein said material is provided on at least one surface with a release paper through a bonding agent locally or wholly applied thereto.

9. A method of producing a radio wave shielding material, which comprises:
    forming a metal plating coat on a surface of a plastic foamed body having a three-dimensional network skeleton structure;
    impregnating or applying a liquid composition containing a conductive rubber and/or plastic to said plastic foamed body;
    subjecting said body to a compression deformation to squeeze out an excess amount of said liquid composition while said metal plating coat is partially broken to provide a proper compression modulus; and
    curing said conductive rubber and/or plastic.

10. A method according to claim 9, wherein said metal plating coat is formed by an electroless plating process.

11. A method according to claim 10, wherein said plastic foamed body is subjected to a surface treatment prior to said electroless plating.

12. A method according to claim 9, wherein said compression deformation is a compression strain of 10–90%.

* * * * *